(12) United States Patent
Karlsen et al.

(10) Patent No.: US 10,295,405 B2
(45) Date of Patent: May 21, 2019

(54) ACTIVE MONITORING OF MULTI-LASER SYSTEMS

(71) Applicant: nLIGHT, Inc., Vancouver, WA (US)

(72) Inventors: Scott R. Karlsen, Battle Ground, WA (US); Jay Small, Vancouver, WA (US); Mitch Stanek, Vancouver, WA (US); Vito P. Errico, Vancouver, WA (US); Cary S. Kiest, Albany, OR (US)

(73) Assignee: nLIGHT, Inc., Vancouver, WA (US)

( * ) Notice: Subject to any disclaimer, the term of this patent is extended or adjusted under 35 U.S.C. 154(b) by 112 days.

(21) Appl. No.: 15/079,664

(22) Filed: Mar. 24, 2016

(65) Prior Publication Data

US 2016/0209267 A1    Jul. 21, 2016

Related U.S. Application Data

(63) Continuation of application No. 13/828,336, filed on Mar. 14, 2013, now Pat. No. 9,310,248.

(51) Int. Cl.
*G01J 1/42*     (2006.01)
*H01S 5/00*    (2006.01)
(Continued)

(52) U.S. Cl.
CPC ........... *G01J 1/4257* (2013.01); *G01J 1/4228* (2013.01); *H01S 5/0014* (2013.01); *H01S 5/042* (2013.01); *H01S 5/4012* (2013.01); *H01S 5/4025* (2013.01); *G01J 1/0414* (2013.01); *G01J 1/0437* (2013.01)

(58) Field of Classification Search
CPC .................................................. G01J 1/4257
See application file for complete search history.

(56) References Cited

U.S. PATENT DOCUMENTS 3,748,015 A    7/1973  Offner
3,773,404 A    11/1973  Moore
(Continued)

FOREIGN PATENT DOCUMENTS

CN    101529288    9/2009
CN    101656394    2/2010
(Continued)

OTHER PUBLICATIONS

First Office Action from the State Intellectual Property Office of the People's Republic of China for Chinese App. No. 201510120720.6, dated Sep. 15, 2017, 13 pages.
(Continued)

*Primary Examiner* — Thanh Luu
(74) *Attorney, Agent, or Firm* — Klarquist Sparkman, LLP

(57)    ABSTRACT

A monitoring system for a multi-laser module includes detectors corresponding to each laser and situated to receive a portion of the associated laser beam uncombined with other beams. Laser characteristics are measured and stored, and in operation are used to identify device failures. A comparator receives a reference value and compares the reference value with a current operational value. If the current value is less that the reference value, a possible failure is indicated. Signal cross-coupling among the detectors is also used to identify undesirable scattering that can be associated with surface contamination or device failure.

18 Claims, 12 Drawing Sheets

(51) Int. Cl.
*H01S 5/042* (2006.01)
*H01S 5/40* (2006.01)
*G01J 1/04* (2006.01)

(56) References Cited

U.S. PATENT DOCUMENTS

| | | | |
|---|---|---|---|
| 4,293,186 A | 10/1981 | Offner | |
| 4,377,339 A | 3/1983 | Coppock | |
| 4,492,427 A | 1/1985 | Lewis et al. | |
| 4,536,639 A | 8/1985 | Crahay | |
| 4,688,904 A | 8/1987 | Hirose et al. | |
| 4,711,535 A | 12/1987 | Shafer | |
| 4,932,747 A | 6/1990 | Russell et al. | |
| 5,153,773 A | 10/1992 | Muraki et al. | |
| 5,224,200 A | 6/1993 | Rasmussen et al. | |
| 5,517,359 A | 5/1996 | Gelbart | |
| 5,586,132 A | 12/1996 | Levy | |
| 5,619,245 A | 4/1997 | Kessler et al. | |
| 5,638,220 A | 6/1997 | Ohtomo et al. | |
| 5,673,135 A | 9/1997 | Yoshino et al. | |
| 5,719,704 A | 2/1998 | Shiraishi et al. | |
| 5,936,761 A | 8/1999 | Kubota et al. | |
| 6,040,553 A | 3/2000 | Ross | |
| 6,114,088 A | 9/2000 | Wolk et al. | |
| 6,169,565 B1 | 1/2001 | Ramanujan et al. | |
| 6,498,680 B1 | 12/2002 | Zhou | |
| 6,509,547 B1 | 1/2003 | Bernstein et al. | |
| 6,529,542 B1 | 3/2003 | Karlsen et al. | |
| 6,531,681 B1 | 3/2003 | Markle et al. | |
| 6,560,039 B1 | 5/2003 | Webb et al. | |
| 6,618,174 B2 | 9/2003 | Parker et al. | |
| 6,678,308 B1 | 1/2004 | Matthews | |
| 6,707,532 B2 | 3/2004 | Suzuki | |
| 6,873,398 B2 | 3/2005 | Sievers | |
| 6,980,295 B2 | 12/2005 | Lerner | |
| 6,985,226 B2 | 1/2006 | Lerner | |
| 7,006,217 B2 | 2/2006 | Lerner | |
| 7,158,215 B2 | 1/2007 | Harned | |
| 7,167,630 B2 | 1/2007 | Eyal et al. | |
| 7,253,376 B2 | 8/2007 | Zhang et al. | |
| RE39,846 E | 9/2007 | Tanitsu et al. | |
| 7,277,229 B2 | 10/2007 | Kato | |
| 7,293,882 B2 | 11/2007 | Lerner | |
| 7,317,469 B2 | 1/2008 | Kim | |
| 7,355,800 B2 | 4/2008 | Anikitchev | |
| 7,418,172 B2 | 8/2008 | Tanaka et al. | |
| 7,502,537 B2 | 3/2009 | Kurahashi | |
| 7,519,493 B2 | 4/2009 | Atwell et al. | |
| 7,545,403 B2 | 6/2009 | Kang et al. | |
| 7,545,446 B2 | 6/2009 | Lerner et al. | |
| 7,704,666 B2 | 4/2010 | Noh et al. | |
| 7,745,991 B2 | 6/2010 | Yamazaki et al. | |
| 7,776,493 B2 | 8/2010 | Kang et al. | |
| 7,792,249 B2 | 9/2010 | Gertner et al. | |
| 7,821,718 B1 | 10/2010 | Govyadinov et al. | |
| 7,847,940 B2 | 12/2010 | Karasyuk et al. | |
| 7,851,725 B2 | 12/2010 | Dane et al. | |
| 7,885,012 B2 | 2/2011 | Reynolds | |
| 7,892,382 B2 | 2/2011 | Bellmann et al. | |
| 7,970,040 B1 | 6/2011 | Sprangle | |
| 7,995,298 B2 | 8/2011 | Chen | |
| 8,062,986 B2 | 11/2011 | Khrapko et al. | |
| 8,483,533 B1 | 7/2013 | Mehl | |
| 8,821,963 B2 | 9/2014 | Tanaka et al. | |
| 2003/0016450 A1 | 1/2003 | Bluemel et al. | |
| 2003/0128543 A1 | 7/2003 | Rekow | |
| 2003/0202251 A1 | 10/2003 | Yamazaki | |
| 2003/0226834 A1 | 12/2003 | Ishikawa | |
| 2004/0036961 A1 | 2/2004 | McGuire | |
| 2004/0065646 A1 | 4/2004 | Halpin | |
| 2004/0090609 A1 | 5/2004 | Komatsuda | |
| 2004/0223330 A1 | 11/2004 | Broude et al. | |
| 2004/0258377 A1 | 12/2004 | Berkey et al. | |
| 2005/0045604 A1 | 3/2005 | Talwar et al. | |
| 2005/0098260 A1 | 5/2005 | Chen | |
| 2006/0012842 A1 | 1/2006 | Abu-Ageel | |
| 2006/0102605 A1 | 5/2006 | Adams et al. | |
| 2006/0176912 A1 | 8/2006 | Anikitchev | |
| 2006/0246693 A1 | 11/2006 | Tanaka et al. | |
| 2007/0063226 A1 | 3/2007 | Tanaka et al. | |
| 2007/0084837 A1 | 4/2007 | Kosmowski | |
| 2007/0147065 A1 | 6/2007 | Nagata | |
| 2007/0153847 A1 | 7/2007 | Faircloth et al. | |
| 2008/0025732 A1 | 1/2008 | Hattori | |
| 2008/0137042 A1 | 6/2008 | Alasaarela | |
| 2008/0210671 A1 | 9/2008 | Jennings et al. | |
| 2008/0268201 A1 | 10/2008 | Fiacco et al. | |
| 2008/0308534 A1 | 12/2008 | Li et al. | |
| 2009/0046923 A1 | 2/2009 | Chang et al. | |
| 2009/0127477 A1 | 5/2009 | Tanaka | |
| 2009/0168149 A1 | 7/2009 | Petersson et al. | |
| 2009/0236495 A1 | 9/2009 | Jennings et al. | |
| 2009/0296751 A1 | 12/2009 | Kewitsch et al. | |
| 2010/0033508 A1* | 2/2010 | Mizushima | G09G 3/3406 345/690 |
| 2010/0048036 A1 | 2/2010 | Tanaka et al. | |
| 2010/0097680 A1 | 4/2010 | Naftali et al. | |
| 2010/0140478 A1 | 6/2010 | Wilson et al. | |
| 2010/0171931 A1 | 7/2010 | Kessler | |
| 2010/0254717 A1 | 10/2010 | Miller | |
| 2010/0328610 A1* | 12/2010 | Silverstein | G03B 35/26 353/7 |
| 2011/0043900 A1 | 2/2011 | Bayramian | |
| 2012/0045169 A1 | 2/2012 | Hu | |
| 2012/0057345 A1 | 3/2012 | Kuchibhotla | |
| 2012/0069861 A1 | 3/2012 | Neuberger | |
| 2012/0248078 A1 | 10/2012 | Zediker et al. | |
| 2012/0268836 A1 | 10/2012 | Mercado | |
| 2012/0273269 A1 | 11/2012 | Rinzler et al. | |
| 2013/0058092 A1 | 3/2013 | Anisimov | |
| 2013/0077147 A1 | 3/2013 | Efimov | |
| 2013/0107360 A1 | 5/2013 | Kurtz et al. | |

FOREIGN PATENT DOCUMENTS

| | | |
|---|---|---|
| CN | 103227417 | 7/2013 |
| JP | 05-277776 | 10/1993 |
| JP | 2000-343257 | 12/2000 |
| JP | 3563065 | 9/2004 |
| JP | 2006-278491 | 10/2006 |
| JP | 2014013833 | 1/2014 |
| WO | WO 2011/142849 | 11/2011 |

OTHER PUBLICATIONS

Erdmann, et al., "Coherence management for microlens laser beam homogenizers," Proceedings of SPIE, 4775:145-154 (Aug. 2002).
First Office Action from the State Intellectual Property Office of the People's Republic of China for Chinese App. No. 201380012279.9, dated Oct. 26, 2015, 4 pages (w/ an Eng. translation).
French et al., "Absorption Edge and Band Gap of SiO2 Fused Silica Glass," Ceramic Transactions, 28:63-80 (1992).
International Search Report and Written Opinion for International Application No. PCT/US2013/033424, 9 pages, dated Jul. 18, 2013.
Positive Light, Inc. "Relay Imaging in Rod Amplifier Systems," Technical Bulletin, 2 pages, (May 2002).
Schmitt et al., "Illumination uniformity of laserfusion pellets using induced spatial incoherence," Journal of Applied Physics, 60:6-13 (Jul. 1, 1986).
Second Office Action (with an English translation) from the State Intellectual Property Office of the People's Republic of China for Chinese App. No. 201510120720.6, dated Jun. 8, 2018, 8 pages.

\* cited by examiner

ACTIVE MONITORING OF MULTI-LASER SYSTEMS

CROSS-REFERENCE TO RELATED APPLICATION

This application is a continuation of U.S. patent application Ser. No. 13/828,336 filed Mar. 14, 2013, which is incorporated by reference herein.

FIELD

The disclosure pertains to monitoring multi-emitter laser diode systems.

BACKGROUND

High power industrial laser systems have been developed that combine optical power from a plurality of laser diodes for purposes such as materials processing and laser pumping. However, component failure in multi-diode, high power laser systems is often undetectable. In a many-diode system, the failure of a single diode can be difficult to detect, and the overall system can continue to operate, at least temporarily, with a failed or failing laser diode. For high power systems, such undetected laser diode failures are detected only upon eventual system failures, some of which are catastrophic. Laser power continues to be produced even during failure, and the continued production of high optical powers can cause damage to laser systems or injure system operators. Conventional systems monitor an output beam to detect system failures. For a many-diode system, this is generally not effective because for a large number (N) of laser diodes, failure of a single laser diode produces only a reduction in power that is proportional to N−1, which is often practically undetectable.

In view of the shortcomings of conventional systems, improved systems, apparatus, and methods are needed that permit sensitive, rapid determination of laser diode failure. In addition, methods and apparatus are needed that can reconfigure laser diode based systems in response to failures.

SUMMARY

Methods and apparatus are disclosed herein that permit rapid, accurate detection of laser diode failure in multi-diode laser systems. The disclosed methods and systems can avoid laser system damage by de-energizing laser diodes or laser diode arrays that appear to be failed, so that system operation can continue. In addition, in some examples, current operating conditions (or conditions prior to failure) are determined so that the loss of de-energized components is compensated. In other examples, systems are configured to permit convenient laser or laser module replacement in the event of laser failure or degradation. In other alternatives, systems are tolerant to a number of laser failures, and system operation halts only when a predetermined number of lasers fail.

Apparatus comprise a plurality of laser diodes and associated laser drivers configured to produce an optical beam. A detection system is configured to receive portions of optical beams for each of the laser diodes and produce corresponding detector output signals associated with each of the optical beams. A processor is coupled to the laser drivers, the detection system, and the memory so as to establish at least one characteristic parameter for each of the laser diodes. A memory is configured to store at least one characteristic parameter for each of laser diodes. In some examples, the processor is configured to establish a plurality of drive currents for each of the laser diodes and receive detector signals associated with detected optical power at each of the plurality of drive currents for each of the laser diodes. The processor further determines the at least one characteristic parameter based on values associated with the plurality of drive currents and the received signals. In some embodiments, at least one characteristic parameter is associated with a dependence of laser power on drive current. In some alternatives, the processor is coupled to store drive current values and associated received detector signals in the memory. In other examples, the processor is configured to periodically establish a plurality of drive currents for each of the laser diodes and receive signals associated with detected optical power at each of the plurality of drive currents for each of the laser diodes, and store the at least one characteristic parameter in the memory. In some examples, at least one characteristic parameter is associated with a polynomial approximation to laser power as a function of drive current for each of the lasers. In additional examples, a comparator is coupled to the processor, and configured to compare a detector output signal and a reference signal based on at least one characteristic parameter. According to some examples, the processor is configured to terminate operation of a selected laser diode if a detector output signal is less than the reference signal. In still further examples, the detection system includes a photodetector corresponding to each of the laser diodes of the plurality of laser diodes. In typical embodiments, the laser drivers are configured to apply modulated drive currents to the laser diodes, and corresponding detector output signal portions associated with each of the laser diodes are identified based on modulations applied to the laser diodes.

In further examples, the plurality of laser diodes includes a first linear array of laser diodes and a second linear array of laser diodes, and a beam interleaver configured to reflect beams associated with the first linear array and transmit beams associated with the second linear array to the output beam. The detection system includes a first linear array of photodetectors and a second linear array of photodetectors corresponding to the first linear array of laser diodes and the second linear array of laser diodes, respectively, and configured to receive portions of corresponding optical beams for each of the laser diodes. At least one of the first linear array of photodetectors or the second linear array of photodetectors receives the corresponding optical beam portions from the interleaver by transmission or reflection. In further examples, first and second aperture plates are situated at the first and second linear arrays of photodetector, and have first and second linear arrays of apertures corresponding to the photodetectors of the first linear array and the second linear array, respectively. In other embodiments, the processor is configured so that a laser drive current is applied to a selected laser diode, and the detected signal is associated with one or more photodetectors corresponding to laser diodes other than the selected laser diode. In some cases, the detected signal is associated with at least one photodetector adjacent the photodetector associated with the selected laser diode. In still other examples, the processor is configured to issue an alert if the detected signal is greater than a predetermined value. According to other examples, the processor is configured so that laser drive currents are serially applied to each of the laser diodes, and serially detected signals are obtained from one or more photodetectors corresponding to laser diodes other than a currently selected laser diode.

Methods comprise establishing a reference level associated with each of a plurality of laser diodes, wherein the reference level is based on detected optical signals associated with each of the laser diodes at respective photodetectors. The laser diodes are energized, and measured optical signals associated with each of the laser diodes are compared with corresponding reference levels. Based on the comparisons, a channel error is identified. In some examples, the reference level is established based on a polynomial fit to laser power as a function of drive current.

Apparatus comprise a plurality of optical emitters and a plurality of optical detectors, each corresponding to a respective optical emitter and each situated in an optical path associated with the respective optical emitter. A controller is configured to energize a selected optical emitter and receive detector signals associated with optical detectors corresponding to at least one of the unselected optical emitters. Based on the received detector signal, the processor identifies a channel error. According to some examples, a display is coupled to the controller, wherein the controller is configured to indicate received detected signal values for the plurality of detectors with the display. In some cases, the controller is operable so that the display includes a user interface area associated with user selection of the selected optical emitter with a computer pointing device.

The foregoing and other objects, features, and advantages of the disclosed technology will become more apparent from the following detailed description, which proceeds with reference to the accompanying figures.

DETAILED DESCRIPTION

Figure 1:
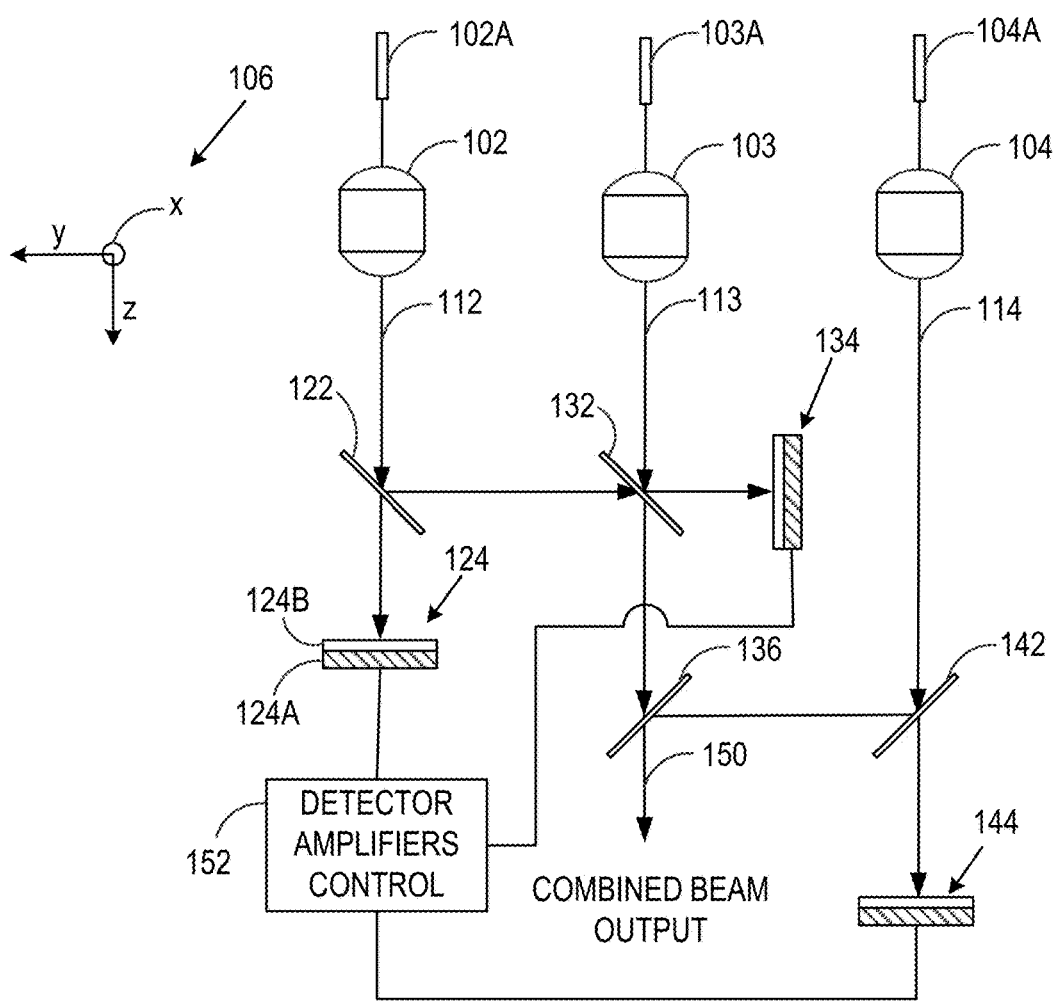
FIG. 1 illustrates a portion of a multi-module laser diode system that combines beams from a plurality of laser diode modules, each of which includes multiple laser diodes.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus are referred to as "lowest", "best", "minimum," or the like. It will be appreciated that such descriptions are intended to indicate that a selection among many used functional alternatives can be made, and such selections need not be better, smaller, or otherwise preferable to other selections. In the described examples, laser diode operation is monitored to identify power levels that are less than reference values. Such monitoring permits identification of failing diodes and damage to optical components and other system changes. In other examples, laser diode operation is monitored with respect to high and/or low reference values. The embodiments below can be implemented in hardware, software, or a combination of both. In some examples, programmable logic devices or general purpose processors can be used. While parallel acquisition of data values is often preferred, either serial or parallel data acquisition can be used.

FIG. 1 is a side view of a representative assembly for combining optical outputs from a plurality of laser diodes. As shown in FIG. 1, lenses 102, 103, 104 are situated to receive beams from associated laser diodes (not shown) via respective optical fibers 102A, 103A, 104A, and direct the beams along axes 112, 113, 114, respectively. The axes 112, 113, 114 are generally parallel but are displaced in an x-direction (perpendicular to the plane of FIG. 1) as well as a y-axis defined by a coordinate system 106. A beam from the lens 102 is incident to a beam splitter 122 that transmits a portion of the beam to a detector assembly 124 that includes a detector 124A and an aperture plate 124B. In most practical applications, beam powers associated with laser diodes are sufficiently high that even very small fractions of beam power are readily detected. Therefore, beam splitters such as the beam splitter 122 can be configured to have a high reflectivity (at least 90%, 95%, 98%, 99%, 99.5% or higher) and still provide adequate optical power to detectors such as the detector 124A. The aperture plate 124B can include a transmissive aperture so as to attenuate or block optical power from sources other than the lens 102. In some examples, a neutral density or other attenuating optical filter is situated at the detector 124A to further reduce beam optical power to avoid saturating or damaging the detector 124A.

The beam from the lens 103 is directed to a beam interleaver 132 that reflects a portion of the beam from the lens 103 to a detector assembly 134 that is similar to the detector assembly 124. The beam interleaver 132 has a transmissive area such as an anti-reflection coated area situated to transmit the beam from the lens 103 and a reflective area defined by high reflectivity dielectric coating to reflect the beam received from the beam splitter 122 so as to propagate to a beam interleaver 136. The transmissive/reflective areas of the beam interleaver 132 are offset in the x-direction according to the x-offset of the axes 102, 103. In some cases, dielectric coatings exhibit wavelength sensitivity, and dielectric coatings are preferably selected to exhibit low wavelength sensitivity so that laser diode wavelength shifts as a function of temperature do not appear as actual laser output power changes.

The beam from the lens 104 is directed to a beam splitter 142 that reflects a portion of the beam from the lens 104 to the beam interleaver 136 and transmits a portion to a detector assembly 144 that is similar to the detector assemblies 124, 134. The beam interleaver 136 has one or more transmissive areas such as anti-reflection coated areas situated to transmit the beams from the lenses 102, 103. One or more reflective areas are defined by a high reflectivity dielectric coating that is situated to reflect the beam received from the beam splitter 142. As a result, beams from the lenses 102, 103, 104 are combined to propagate as spatially offset beams in a direction 150. A detector/amplifier control 152 is coupled to amplify, buffer, and record detected beam powers reported by the detector assemblies 124, 134, 144. Typically laser diodes are arranged in rows extending in the x-direction, and lenses 102, 103, 104 represent one of many lenses in particular rows.

Figure 2:
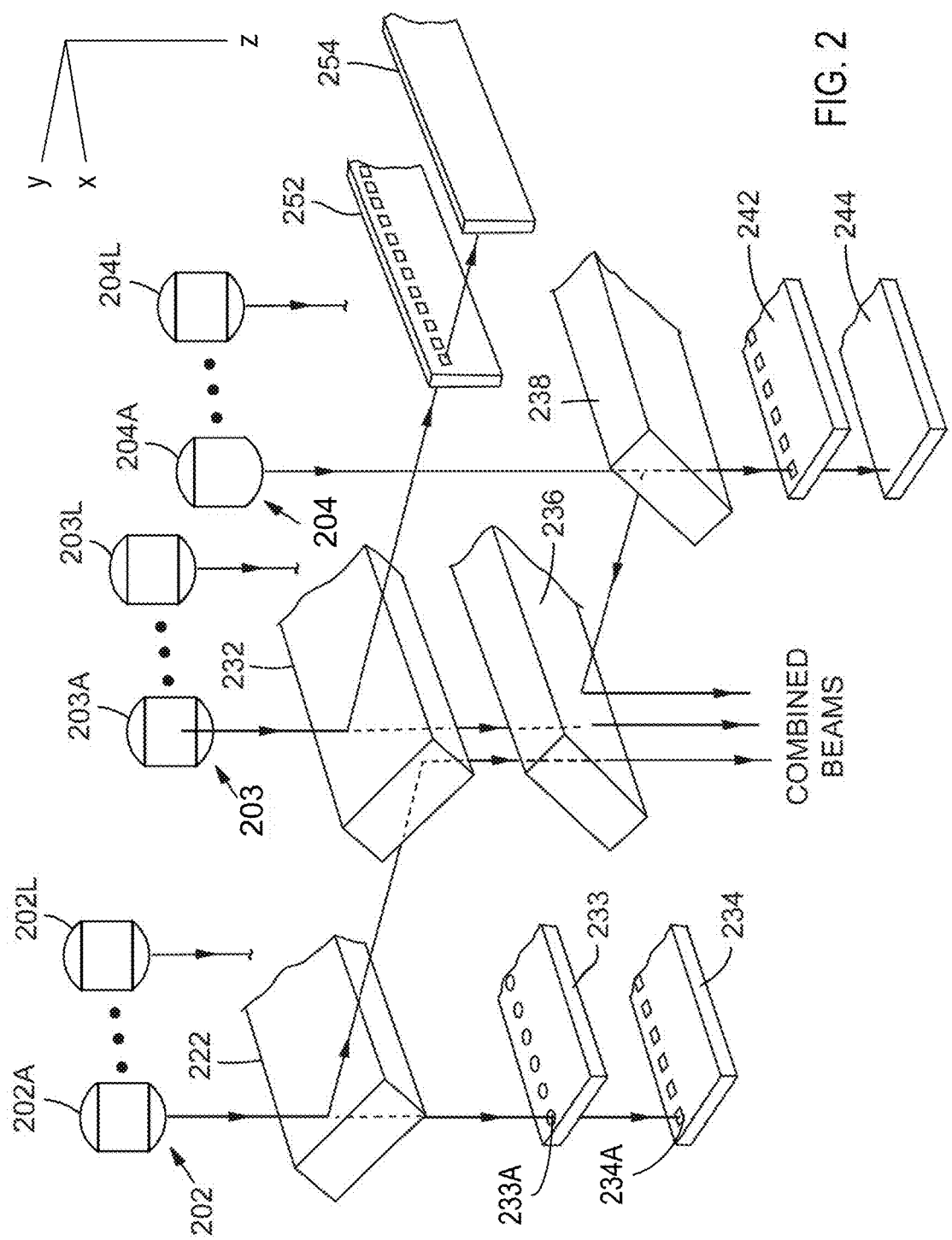
FIG. 2 is a perspective view of another multi-module laser diode system.

In another example, combined beam powers are obtained with a configuration in which beams from three rows of twelve laser diodes per row are combined as spatially offset co-propagating beams as shown in FIG. 2. Respective laser diodes are coupled to lenses 202A-202L, 203A-203L, 204A-204L that are arranged in lens rows 202, 203, 204, each of the rows extending along an x-axis. Beams associated with the row 202 are partially transmitted by a beam splitter 222 to an aperture plate 233 having apertures such as an aperture 233A aligned with respective photodetectors such photodetector 234A of a linear photodetector array 234. (For convenient illustration, refraction at beam splitters and other optical elements is sometimes not shown.) Beams associated with the row 203 are partially reflected by an interleaver 232 to an aperture plate 252 having apertures aligned with photodetectors of a linear photodetector array 254. Beams associated with the row 204 are partially transmitted by a beam splitter 238 to an aperture plate 242 and a linear photodetector array 244. The interleaver 232 and an interleaver 236 are configured to combine beams from the lens rows 202, 203, 204 to produce a combined output beam that includes three y-offset rows of twelve x-offset beams associated with the lenses 202A-202L, 203A-203L, 204A-204L.

Figure 3:
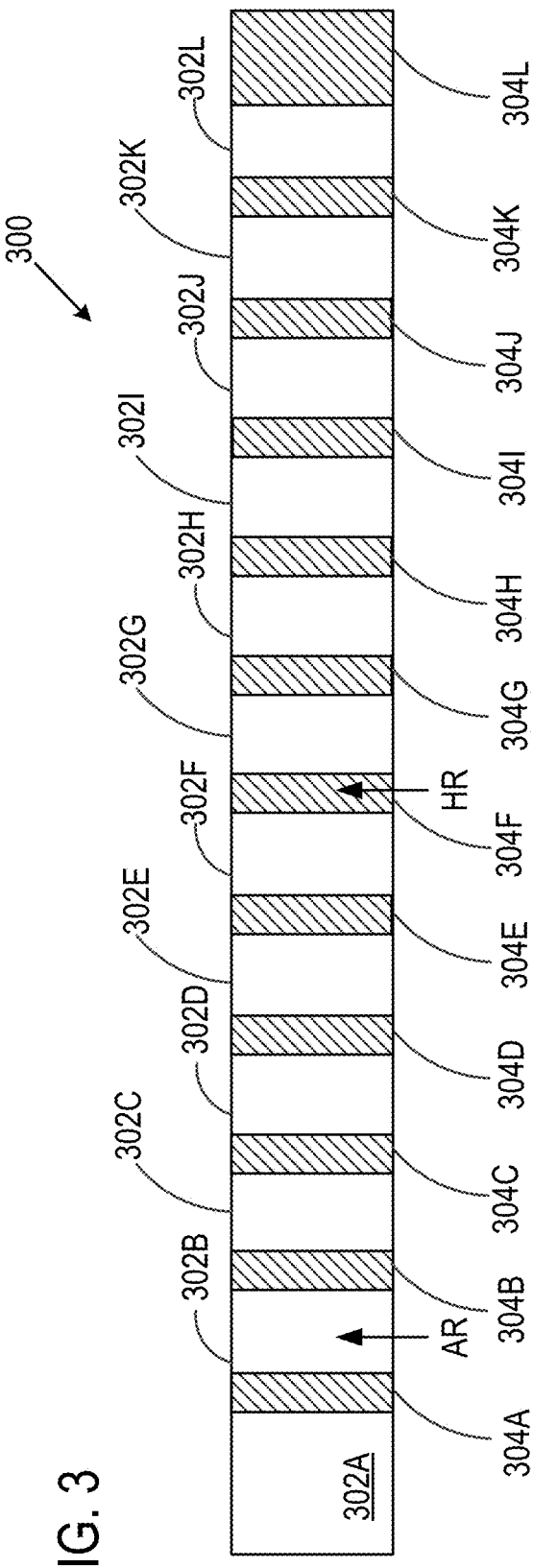
FIG. 3 illustrates a beam interleaver configured to selectively transmit and/or reflect beams so as to interleave received beams and produce a composite beam.

FIG. 3 illustrates a representative interleaver 300 that includes a plurality of antireflection coated (AR) areas 302A-302L and highly reflective coated (HR) areas 304A-304L. As shown in FIG. 3, widths of the AR coated areas 302A-302L are greater than the widths of the HR coated areas 304A-304L as these are configured to transmit offset beams associated with two rows of lenses while the HR coated areas are situated for reflection of beams from a single row of lenses. In other interleaver examples, beams associated with two rows of lenses are reflected, and the HR areas are wider than the AR areas.

Figure 4:
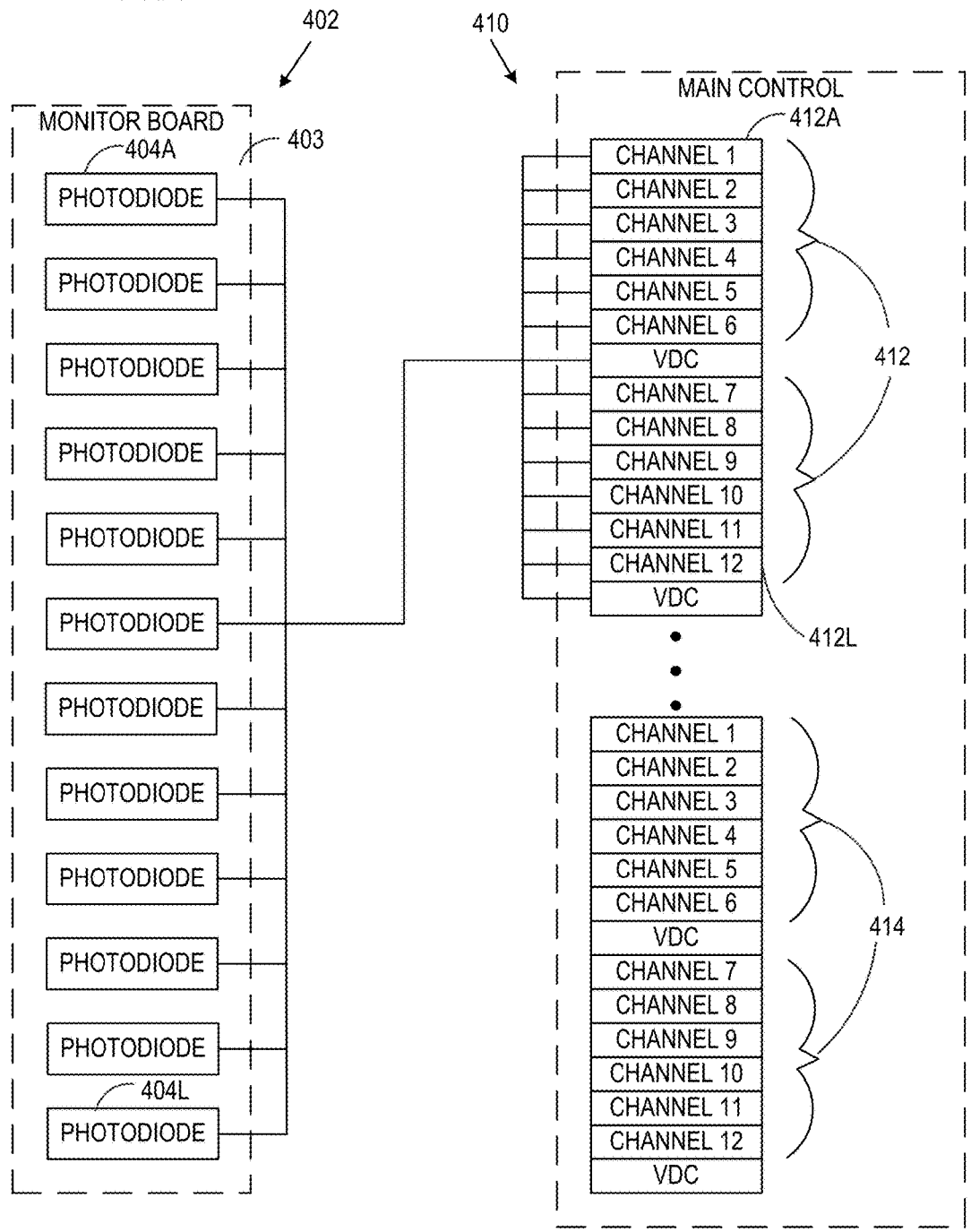
FIG. 4 illustrates a linear photodetector array coupled to a control unit configured to process detected signals associated with the photodetectors of the array.

FIG. 4 illustrates a monitor photodiode system that includes a photodiode array 402 that includes a plurality of photodiodes 404A-404L situated to correspond to respective laser diodes. Typically, discrete photodiodes are secured to a circuit substrate 403 so that photodiode spacing can be matched to laser diode (or lens) spacings, but in other examples, a single linear array of photodetectors can be used. An aperture plate and/or neutral density filters can be provided for some or all photodetectors to control optical power, attenuate any stray light, and reduce coupling of beam power from other than a selected lens. The photodiode array 402 is coupled to a main controller 410 that includes a set 412 of buffer amplifiers 412A-412L and other processing circuitry that are associated with corresponding photodetectors 404A-404L. The main controller 410 also includes a set 414 of buffer amplifiers for an additional photodiode array that is not shown in FIG. 4. For a configuration such as that of FIG. 2, six photodiode arrays and associated amplifiers are used. In addition, an arrangement such as that of FIG. 2 can be stacked with a similar arrangement if additional lasers are needed, and additional monitor photodiodes and circuitry can be provided.

Figure 5:
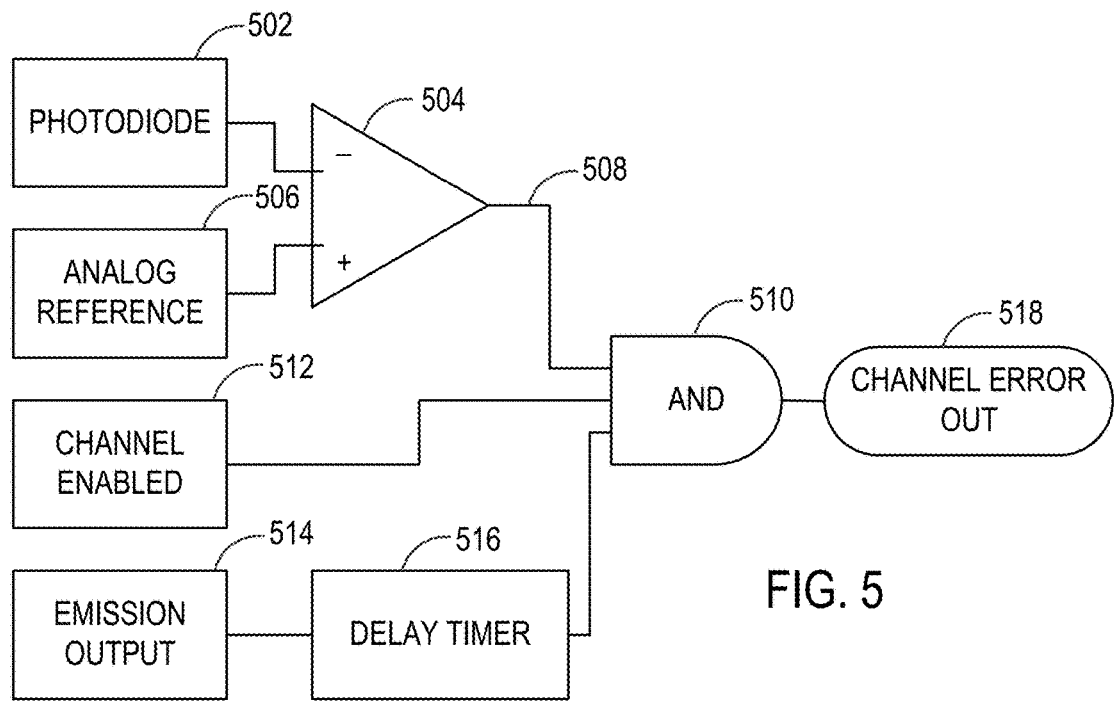
FIG. 5 is a schematic diagram of a system that compares a photodiode signal associated with a selected laser diode with a reference value.

With reference to FIG. 5, a photodiode 502 dedicated to a particular emitter is coupled (typically via a transimpedance amplifier) to a comparator 504 along with a reference voltage from an analog reference source 506. The analog reference voltage is typically based on a previously established performance of the selected emitter and can be associated with a specific emitter drive current, or a predicted or model photodetector signal determined based on an output power/drive current model previously acquired and stored in a fixed computer-readable memory or storage device. A comparator output 508 is coupled to a logic circuit 510 (shown in FIG. 5 as an AND gate) and a channel enabled output 512 that is coupled to provide a signal indicating whether the selected emitter is currently energized. In addition, an emission output 514 associated with emitter drive current is coupled to a delay timer 516 so that emitter output is evaluated at suitable time after drive initiation so that start-up artifacts can be avoided. The logic circuit 510 is coupled to indicate a channel error at an output 518 if the photodiode 502 is reporting emitter power less than the reference value, the channel is enabled, and a sufficient time has elapsed from emitter initiation to avoid artifacts.

Figure 6:
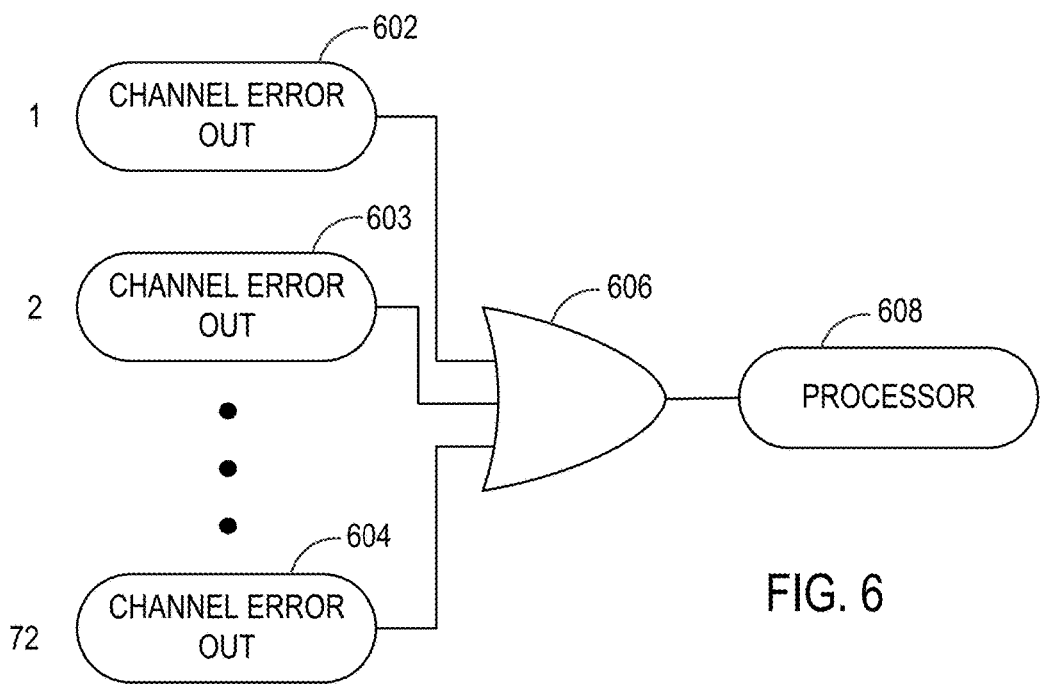
FIG. 6 illustrates a system for detecting channel errors in a many-channel system.

With reference to FIG. 6, representative channel error outputs 602, 603, 604 are coupled to an OR gate 606 that is in turn coupled to a processor 608. If errors are reported in any emitters, the OR gate 606 communicates the presence of an error to the processor 608. In some examples, the processor 608 can shut down emissions from some or all emitters, initiate an operator notification, and/or begin a channel by channel assessment to determine the error source. The error channel can be reported, and a reserve channel initiated as a replacement or drive currents of one or more other emitters increased.

Figure 7:
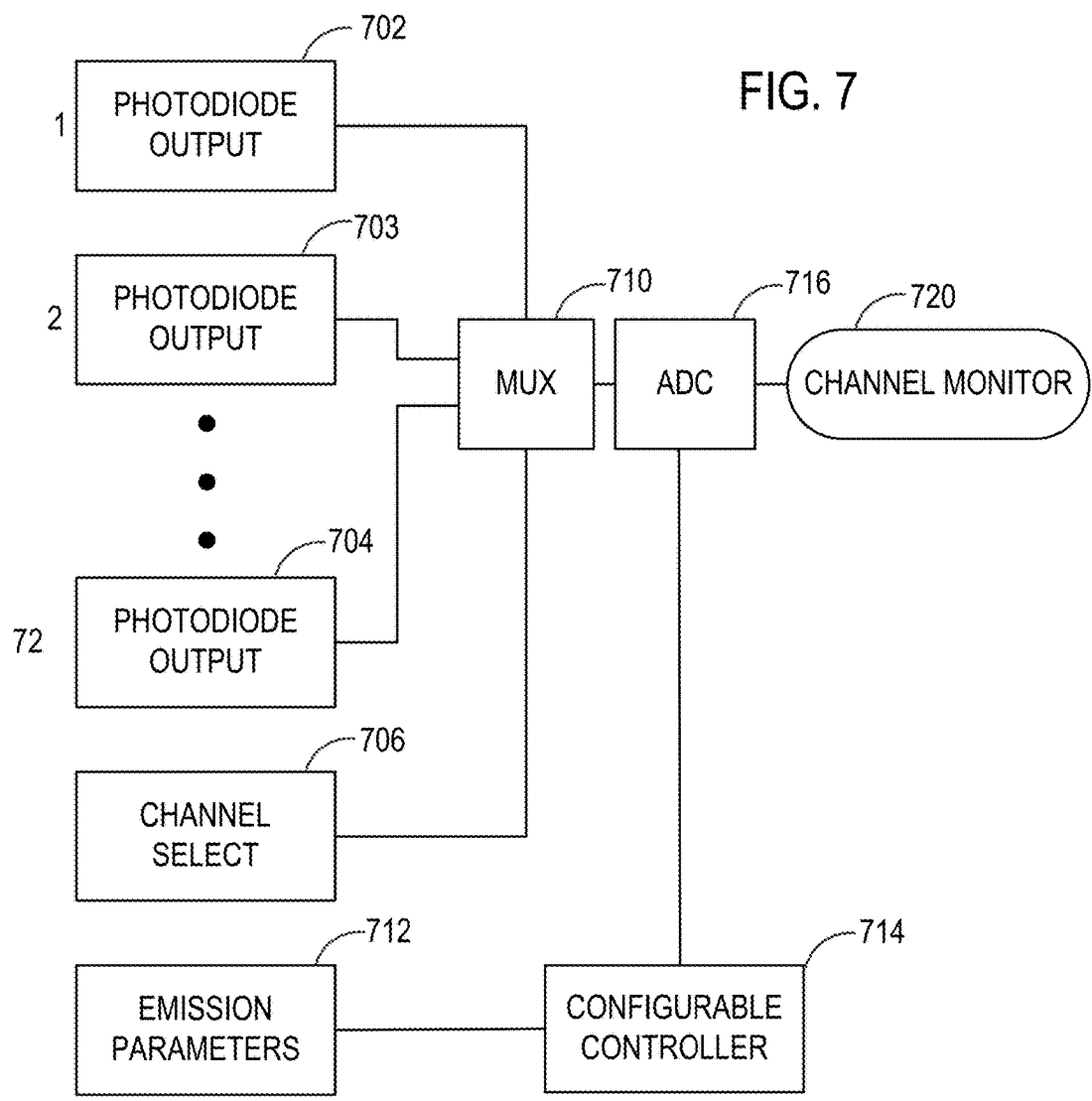
FIG. 7 is a schematic diagram illustrating a system for serially acquiring photodetector signals associated with corresponding laser diodes, and coupling such signals for channel monitoring.

One approach to evaluating multiple emitters is illustrated in FIG. 7. Photodiodes of a set of monitor photodiodes such as representative photodiodes 702-704 are coupled to a multiplexer 710. A control signal associated with a channel selector 706 is coupled to the multiplexer 710 so that a photodiode associated with a particular emitter (i.e., channel) is coupled to an analog-to-digital convertor 716. An emission output 712 is configured to indicate that a selected emitter has been energized, and a delay timer 714 delays coupling an associated signal to the ADC 716 until a predetermined time has elapsed. The ADC 716 then reports a digitized monitor photodiode value to a channel monitor system 720.

Figure 8:
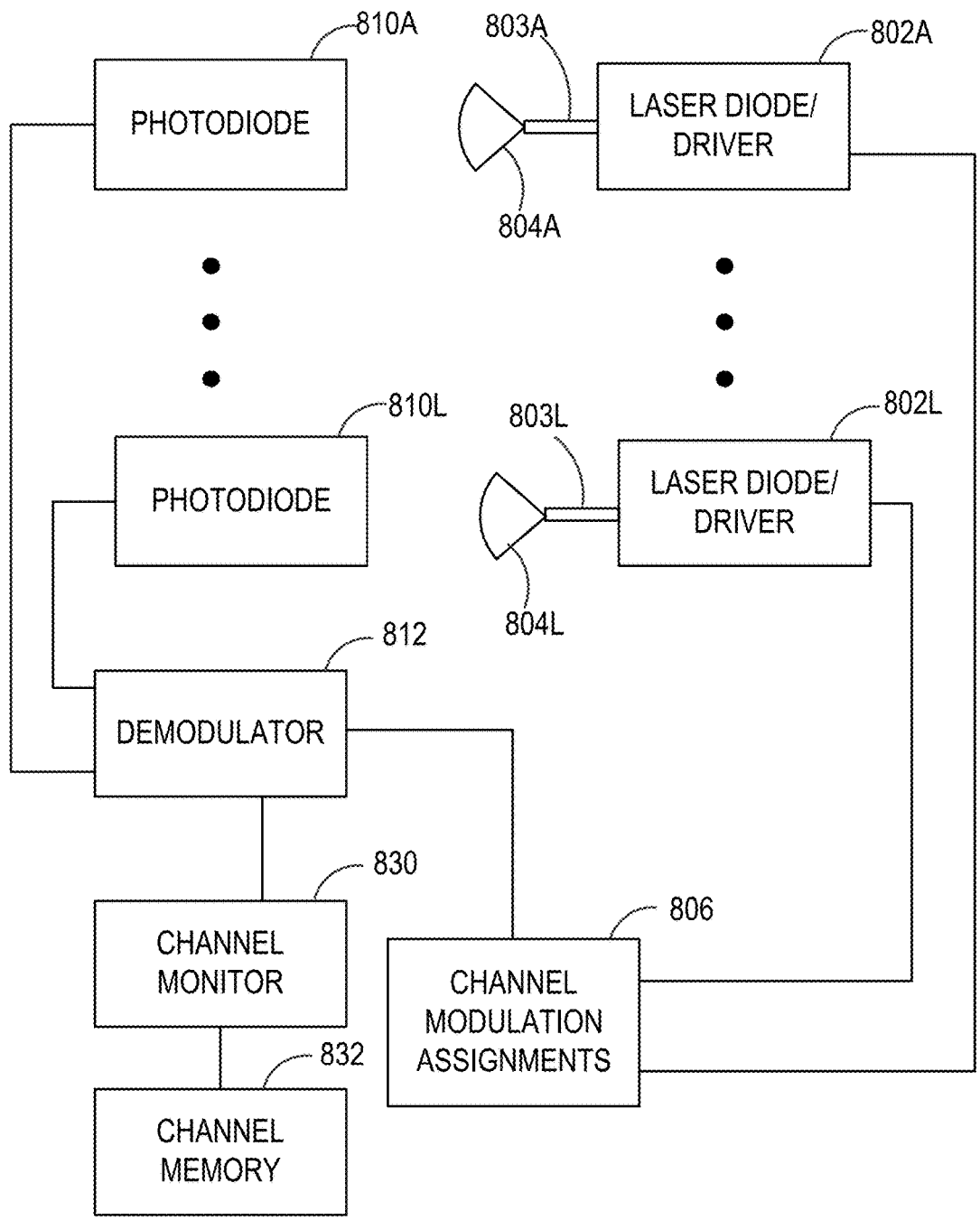
FIG. 8 is a schematic diagram of a system configured to identify lasers associated with particular laser diode optical signals based on drive current modulations applied to the laser diodes.

In some examples, it is convenient to provide a dedicated photodetector for each emitter, or to evaluate emitters by sequentially measuring emitter performance such as output power at one or more emitter drive levels. In other examples, properties of one or more or all emitters can be evaluated in parallel while the emitters are operational using one or several detectors. With reference to FIG. 8, representative laser diode/drivers 802A-802L provide modulated optical beams 804A-804L for corresponding laser diodes based on a stored modulation definition that is retrieved from a memory 806 that can include channel modulation assignments for one or many or all laser diodes. In other examples, a particular laser modulation is defined and fixed by dedicated laser drive circuitry. Monitor photodiodes 810A-810L are coupled to receive portions of emitted beams from respective fibers 803A-803L coupled to the associated laser diode/drivers 802A-802L and photodiode signals are amplified and/or buffered and demodulated based on a modulation assignment with a demodulator 812. Laser diode performance values, such as dependence of output power on drive current, can be directed to a channel monitor 830 as either analog or digital values for one or more detectors, and stored in a channel memory 832. With the configuration of FIG. 8, individual emitters can be recognized by the associated modulation patterns which can be based on, for example, different frequency assignments or orthogonal or other codes. A laser diode drive current need not be heavily modulated, and typically drive current modulations of 10% or less are sufficient, and often less than 1%. In some implementations, a single photodetector can serve to monitor multiple emitters based on demodulation of the modulated photodetector signal. The channel memory 832 can be configured to store emitter data for some or all emitters as a function of service time. Long term emitter changes are then more detectable as they can appear as a trend in stored data.

Figure 9:
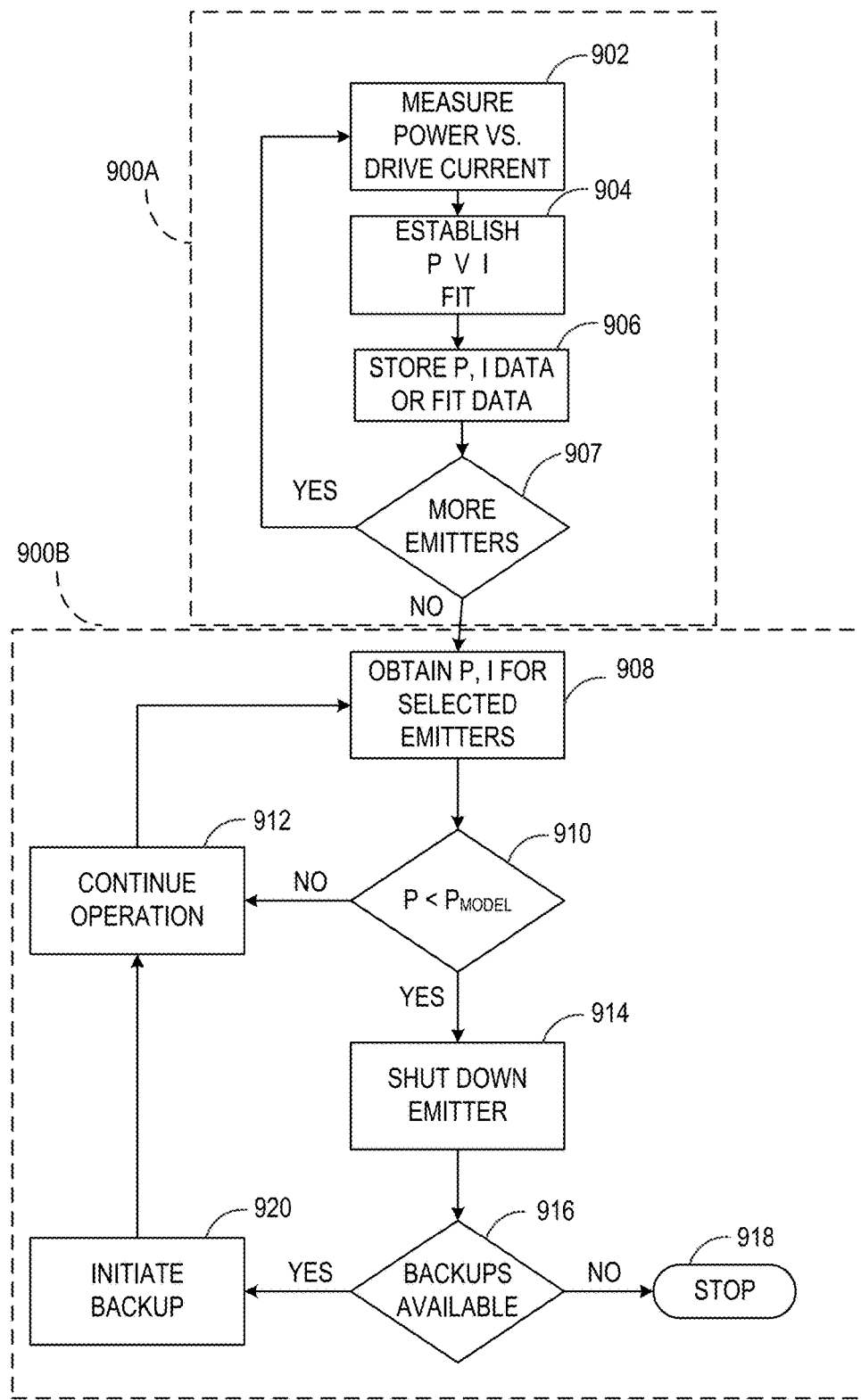
FIG. 9 illustrates a representative method of establishing laser diode characteristics and monitoring laser diodes during operation.

FIG. 9 illustrates a representative method of assessing multi-emitter laser diode systems. In a setup procedure 900A, some or all emitters are evaluated by measuring optical power (P) and detector response as a function of drive current (I) at 902. Response of a particular detector to emitter power depends on emitter wavelength and wavelength dependence of, for example, reflective or other coatings from which emitter beam portions are received. Even if detector response were linear as a function of emitter drive current, wavelength shifts tend to produce non-linear response. At 904, the measured optical power/current data can be fit to a predetermined detector response function such as a polynomial. Power is generally measured a suitable time after a current is applied to the emitter has reached thermal equilibrium. At 906, measured values or parameters associated with the functional fit are stored in a computer readable storage device or memory. This functional fit takes into account non-linear response associated with combined detector/coating response. In some examples, previously stored data is overwritten. At 907, additional emitters can be selected for evaluation. P versus I data is typically obtained and modeled for each emitter using a corresponding detector response model. In addition, for each emitter, optical power at detectors other than the corresponding detector can be measured at one or more emitter drive levels. These values represent unwanted coupling of emitter power to the "wrong" detectors. This information can be used to detect increases in scattering of optical power that can be associated with optical system damage or contamination. Such cross talk information can also be stored along with P/I model data.

In operation, a monitoring method 900B includes obtaining optical power and drive current levels for some or all detectors, either in parallel or in series at 908. Measured optical powers are compared with reference values at 910. Reference values are conveniently obtained by retrieving model data and determining an expected optical power at a particular drive current so as to establish a reference value. If measured power is greater than the reference value, operation continues at 912. If the measured optical power is less than the reference value, a corresponding emitter is shut down at 914. If backups are available at 916, a backup emitter can be initiated at 920. If no backup is available, operation can be halted at 918, if desired. Undesired scattering can be similarly monitored by detecting optical power at detectors other than a detector associated with an emitter to determine possible increases in scattered power. A threshold or reference value for scattering be established, and system operation continued, reconfigured, or terminated.

Figure 10:
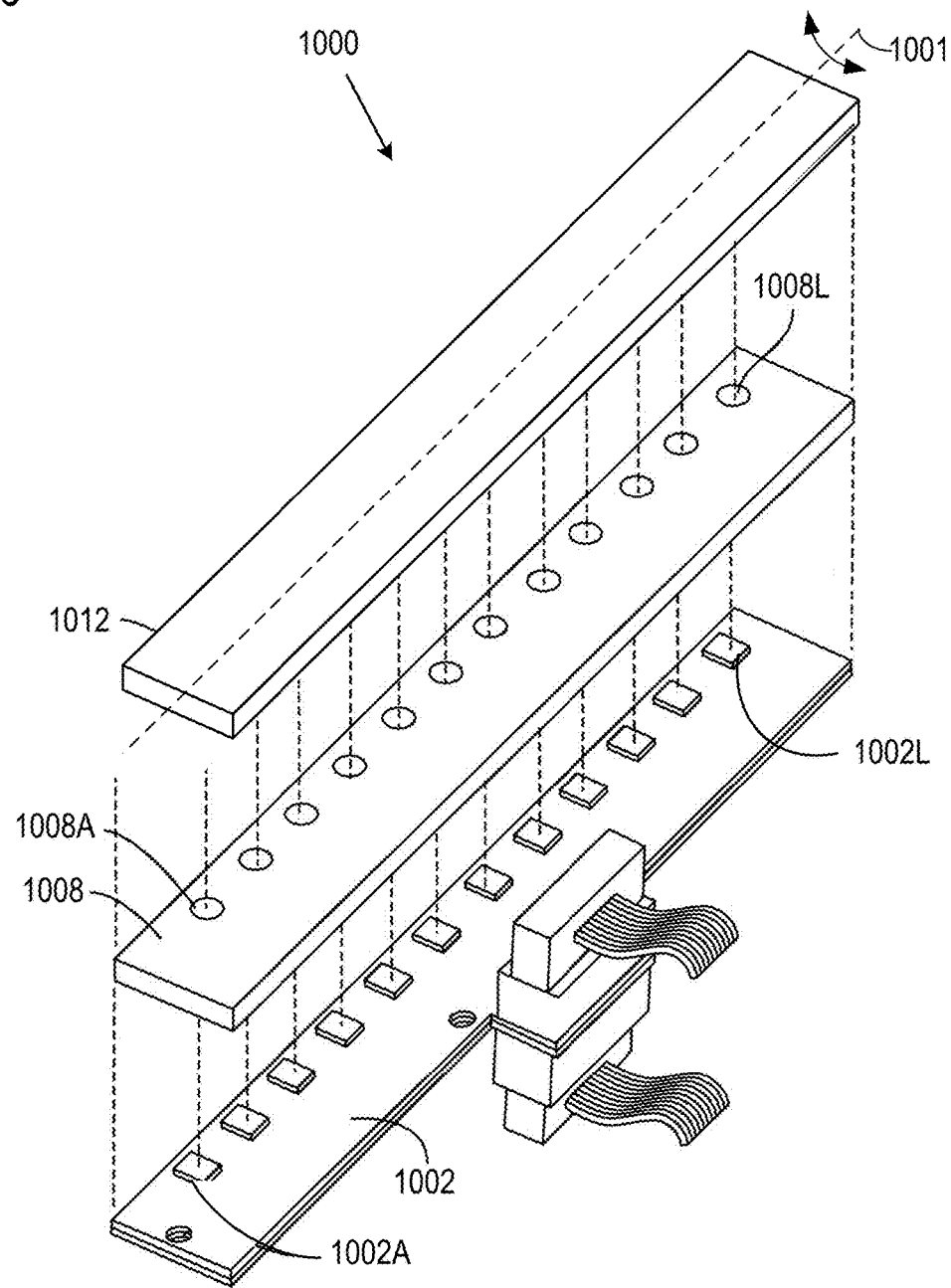
FIG. 10 illustrates a representative photodetector array and an associated aperture plate.

FIG. 10 illustrates a representative photodetector module 1000 that includes an aperture plate 1008 in which apertures 1008A-1008L are defined, and a photodetector array that includes photodetectors 1002A-1002L that are assigned to corresponding emitters and secured to a substrate 1002. A neutral density filter 1012 can also be provided to attenuate optical power reaching the photodetectors 1002A-1002L. If desired, the neutral density filter 1012 can be rotatable about an axis 1001 to vary effective optical density.

Figure 11:
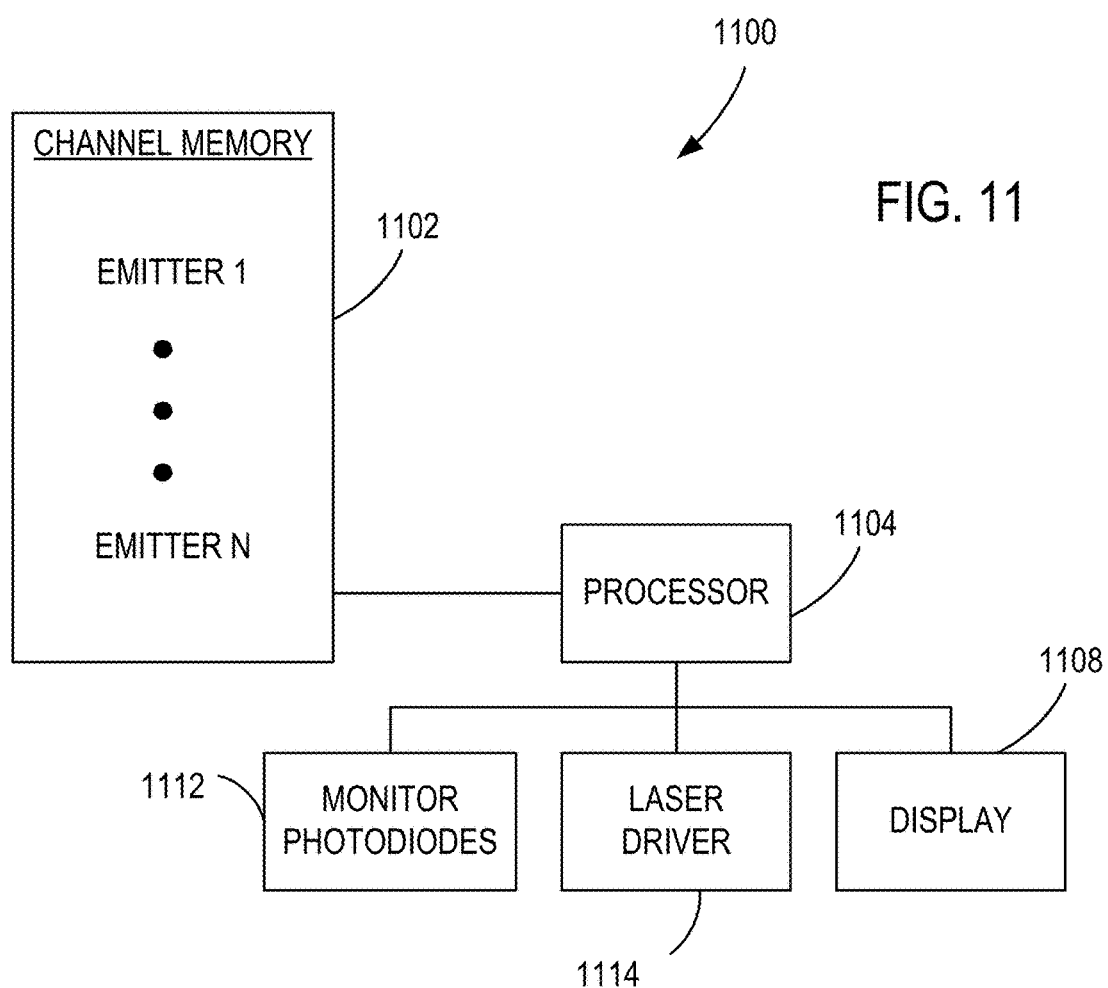
FIG. 11 illustrates a representative multi-emitter monitoring system that includes a channel memory that stores parameters associated with each emitter.

With reference to FIG. 11, a monitoring system 1100 includes a channel memory 1102 configured to store emitter data such as model parameters for optical power as a function of current for each of the emitters. Cross-channel power couplings can also be stored. Some or all data can also be obtained and recorded or modeled as a function of temperature or other conditions. A processor 1104 is coupled to the channel memory 1102 and is configured to store and recall channel values. The processor 1104 is also in communication with a display 1108 for user control, to display stored data, or to issue notifications or warnings. The processor 1104 can also be coupled to a network as well, and data and displays can be remote from the processor 1104. The processor 1104 is also coupled to laser drivers 1110 and monitor photodiodes 1112. The processor 1104 is configured to execute computer-executable instructions associated with comparing emitter outputs and other values with reference values, notifying users of any defective emitters, terminating laser emission if defects are detected, and compensating for disabled lasers. The processor 1104 can also direct acquisition and storage of emitter data as historical data, and can determine single emitter and multi-emitter statistics.

Figure 12A:
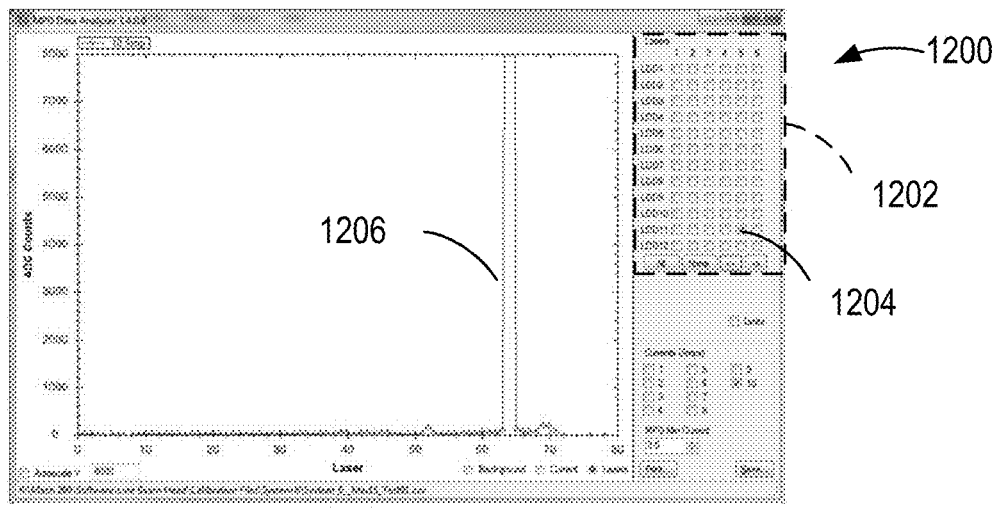
FIGS. 12A-12B are portions of a graphical user interface configured to display detector cross-talk.
Figure 12B:
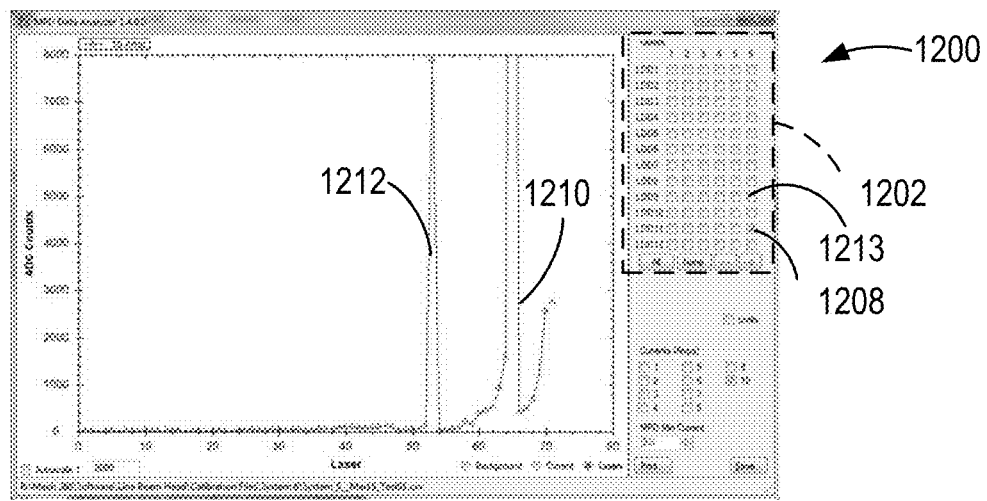

FIGS. 12A-12B illustrate portion of a graphical user interface 1200 for displaying emitter power coupled to non-corresponding detectors. User selection of a particular emitter is accomplished with selection buttons display in an area 1202. As shown in FIG. 12A, an emitter 1204 is selected from among twelve rows of six emitters. Detected optical power is shown at 1206 at a dedicated detector for this emitter. Small (acceptable) powers are shown that are coupled to other detectors as well. FIG. 12B shows detected optical power 1210 at a detector corresponding to selected emitter 1208 in an eleventh row of emitters. In addition, optical power at 1212 is shown at a detector that is associated with an emitter in a ninth row of emitters. This optical power shows significant scattering or other unusual coupling of power from the selected emitter 1208.

Figure 13A:
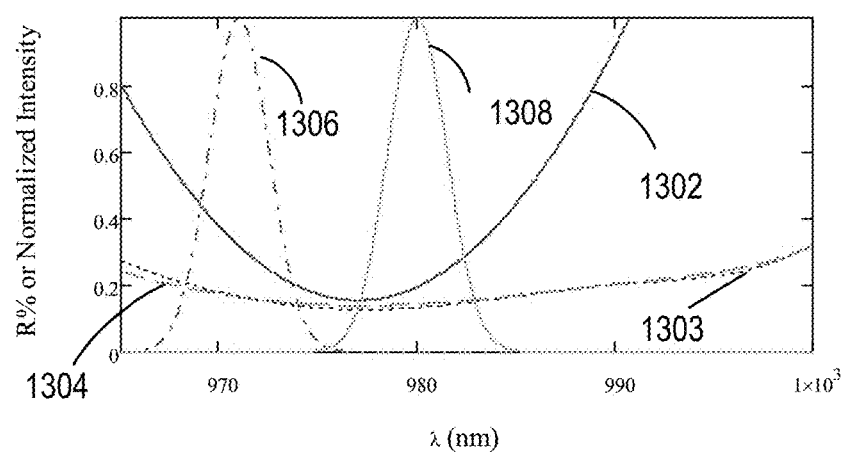
FIGS. 13A-13B illustrate the effects of wavelength dependent interleaver reflectivity.
Figure 13B:
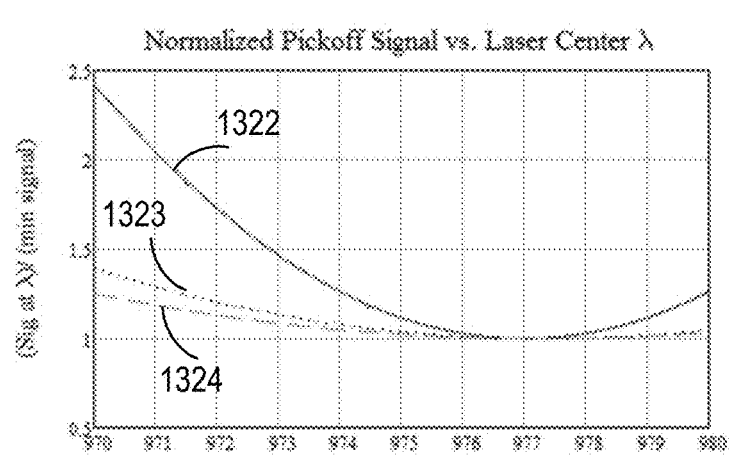

FIGS. 13A-13B illustrate the effects of wavelength dependent interleaver reflectivity. Effective reflectivity as a function of laser diode wavelength for three different coatings based on typical laser diode spectra is shown as curves 1303-1305 along with representative laser diode emission spectra curves 1306, 1308. At a center wavelength associated with the emission curve 1306, reflectivity differences between coatings are as much as about 0.2%. However, total reflectivities associated with the curves 1303-1305 range from about 0.2% to about 0.4% so that a 0.2% different is substantial. FIG. 13B includes spectral curves 1322-1324 that illustrate normalize reflected power as a function of laser diode center wavelength corresponding to the curves 1303-1305. Substantial differences between coatings and as a function of wavelength for a single coating are apparent. Such effects can appear as unacceptable changes in laser diode or optical system performance, but in the methods and systems disclosed above, detector response is calibrated to eliminate or reduce such effects. In typical examples, interleaver antireflection coatings that couple beam to monitor photodiodes have reflectivities of less than 4%, 2%, 1%, 0.5%, 0.2% and variations as a function of wavelength can be compensated. In some cases, without compensation, large monitor diode response variations from laser diode to laser diode could be mistakenly as laser diode or optical system performance issues.

Having described and illustrated the principles of the disclosed technology with reference to the illustrated embodiments, it will be recognized that the illustrated embodiments can be modified in arrangement and detail without departing from such principles. For instance, elements of the illustrated embodiments shown in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used. We claim as our invention all that comes within the scope and spirit of the appended claims.

We claim:

1. An apparatus, comprising:
   a plurality of laser modules and associated laser drivers, each laser module including an array of laser diodes and a beam combining system including one or more reflectors and one or more transmissive regions, wherein the laser diodes are situated to emit beams that are spatially offset from each other that are directed with the beam combining system to form a combined beam;
   a detection system situated to receive portions of each of emitted beams and to produce corresponding detector output signals;
   a memory configured to store at least one characteristic parameter for each of the laser diodes; and
   a processor coupled to the laser drivers, the detection system, and the memory so as to establish the at least one characteristic parameter for each of the laser diodes;
   wherein the processor is configured to increase drive current associated with one or more other laser modules in response to a channel error associated with a particular laser module;
   wherein the processor is configured to terminate operation of a selected laser diode if detector output signal is less than a reference signal.

2. The apparatus of claim 1, wherein the arrays of laser diodes include first linear arrays of laser diodes and second linear arrays of laser diodes, and the one or more reflectors are situated to reflect the beams so as to propagate as the combined beam.

3. The apparatus of claim 1, wherein the detection system includes a photodetector corresponding to each of the laser modules of the plurality of laser modules.

4. The apparatus of claim 1, wherein the processor is configured to periodically establish a plurality of drive currents for each of the laser diodes and receive signals associated with detected optical power at each of the plurality of drive currents for each of the laser diodes, and store the at least one characteristic parameter in the memory.

5. The apparatus of claim 1, wherein the at least one characteristic parameter is associated with a polynomial approximation to laser power as a function of drive current for each of the lasers.

6. The apparatus of claim 1, wherein the detector output signals are associated with a scattered optical power from at least one laser module.

7. The apparatus of claim 1, wherein the laser drivers are configured to apply modulated drive currents to the laser modules, and corresponding detector output signal portions associated with each of the laser modules are identified based on the applied modulated drive currents.

8. The apparatus of claim 7, wherein the processor is configured to compare the characteristic parameters of the laser diodes of the identified laser modules against one or more reference quantities stored in the memory so as to detect a variation of the characteristic parameters corresponding to a service time of the identified laser modules.

9. The apparatus of claim 8, wherein the reference quantities are established for each of the plurality of laser modules based on polynomial fits to corresponding photodetector responses as a function of laser module drive current.

10. An apparatus, comprising:
    a plurality of laser modules and associated laser drivers, each laser module including an array of laser diodes and a beam combining system including one or more reflectors and one or more transmissive regions, wherein the laser diodes are situated to emit beams that are spatially offset from each other that are directed with the beam combining system to form a combined beam;
    a detection system situated to receive portions of each of emitted beams and to produce corresponding detector output signals;
    a memory configured to store at least one characteristic parameter for each of the laser diodes; and a processor coupled to the laser drivers, the detection system, and the memory so as to establish the at least one characteristic parameter for each of the laser diodes;

wherein the detection system includes a plurality of optical detectors, each situated in a respective optical path associated with one or more of the laser diodes;

wherein the processor is configured to energize a selected one or more of the laser diodes and to receive a detector signal associated with at least one optical detector associated with at least one of the unselected laser diodes, and based on the received detector signal, identify a channel error.

11. The apparatus of claim 10, wherein the processor is configured to terminate operation of a selected laser diode if detector output signal is less than a reference signal.

12. The apparatus of claim 10, further comprising a display coupled to the processor, wherein the processor is configured to indicate with the display received detected signal values for the plurality of optical detectors.

13. The apparatus of claim 12, wherein the processor is operable so that the display includes a user interface area associated with user selection of the selected one or more laser diodes with a computer pointing device.

14. An apparatus, comprising:
a plurality of laser modules and associated laser drivers, each laser module including an array of laser diodes and a beam combining system including one or more reflectors and one or more transmissive regions, wherein the laser diodes are situated to emit beams that are spatially offset from each other that are directed with the beam combining system to form a combined beam;
a detection system situated to receive portions of each of emitted beams and to produce corresponding detector output signals;
a memory configured to store at least one characteristic parameter for each of the laser diodes; and
a processor coupled to the laser drivers, the detection system, and the memory so as to establish the at least one characteristic parameter for each of the laser diodes;
wherein the processor is configured to energize a laser driver associated with a selected laser module and to receive a detector output signal from the detection system that is associated with an optical detector corresponding to at least one of the unselected laser modules, and based on the received detector output signal, identify a channel error.

15. An apparatus, comprising:
a plurality of laser modules and associated laser drivers, each laser module including an array of laser diodes and a beam combining system including one or more reflectors and one or more transmissive regions, wherein the laser diodes are situated to emit beams that are spatially offset from each other that are directed with the beam combining system to form a combined beam;
a detection system situated to receive portions of each of emitted beams and to produce corresponding detector output signals;
a memory configured to store at least one characteristic parameter for each of the laser diodes; and
a processor coupled to the laser drivers, the detection system, and the memory so as to establish the at least one characteristic parameter for each of the laser diodes;
wherein the processor is configured to increase drive current associated with one or more other laser modules in response to a channel error associated with a particular laser module;
wherein the detector output signals are associated with a scattered optical power from at least one laser module.

16. An apparatus, comprising:
a plurality of laser modules and associated laser drivers, each laser module including an array of laser diodes and a beam combining system including one or more reflectors and one or more transmissive regions, wherein the laser diodes are situated to emit beams that are spatially offset from each other that are directed with the beam combining system to form a combined beam;
a detection system situated to receive portions of each of emitted beams and to produce corresponding detector output signals;
a memory configured to store at least one characteristic parameter for each of the laser diodes; and
a processor coupled to the laser drivers, the detection system, and the memory so as to establish the at least one characteristic parameter for each of the laser diodes;
wherein at least one measured optical signal is obtained by reflection from a dielectric coating, and an associated reference level is established to compensate wavelength dependence of the dielectric coating.

17. An apparatus, comprising:
a plurality of laser modules and associated laser drivers, each laser module including an array of laser diodes and a beam combining system including a plurality of directional reflectors situated to receive and directionally reflect a plurality of incident laser beams, emitted by the laser diodes, to propagate along parallel reflected beam propagation axes and including one or more transmissive regions, wherein the laser diodes are situated to emit laser beams that are spatially offset from each other that are directed with the beam combining system to form a combined beam;
a detection system situated to receive portions of each of emitted laser beams and to produce corresponding detector output signals;
a memory configured to store at least one characteristic parameter for each of the laser diodes; and
a processor coupled to the laser drivers, the detection system, and the memory so as to establish the at least one characteristic parameter for each of the laser diodes;
wherein the processor is configured to energize a laser driver associated with a selected laser module and to receive a detector output signal from the detection system that is associated with an optical detector corresponding to at least one of the unselected laser modules, and based on the received detector output signal, identify a channel error.

18. The apparatus of claim 17, wherein the arrays of laser diodes include first linear arrays of laser diodes and second linear arrays of laser diodes, and the one or more directional reflectors are situated to reflect the laser beams so as to propagate as the combined beam.

* * * * *